(12) United States Patent
Sheu

(10) Patent No.: US 6,180,459 B1
(45) Date of Patent: Jan. 30, 2001

(54) METHOD FOR FABRICATING A FLASH MEMORY WITH SHALLOW TRENCH ISOLATION

(75) Inventor: Yau-Kae Sheu, Hsinchu (TW)

(73) Assignee: United Semiconductor Corp., Hsinchu (TW)

(*) Notice: Under 35 U.S.C. 154(b), the term of this patent shall be extended for 0 days.

(21) Appl. No.: 09/227,974

(22) Filed: Jan. 8, 1999

(30) Foreign Application Priority Data

Dec. 18, 1998 (TW) .................................................. 87121152

(51) Int. Cl.[7] .................................................. H01L 21/8247
(52) U.S. Cl. ............................................. 438/264; 438/296
(58) Field of Search ................................. 438/257, 258, 438/259, 264, 296, 424, 633

(56) References Cited

U.S. PATENT DOCUMENTS 5,387,534 * 2/1995 Prall ...................................... 438/296
5,696,019 * 12/1997 Chang ................................... 438/296

* cited by examiner

*Primary Examiner*—Chandra Chaudhari
(74) *Attorney, Agent, or Firm*—Jiawei Huang; J.C. Patents

(57) ABSTRACT

A method for fabricating a flash memory is provided. The method contains sequentially forming a tunnel oxide layer, a first polysilicon layer, and a silicon nitride layer on a semiconductor substrate. A shallow trench isolation (STI) structure is formed in the substrate to define an active area. During the formation of the STI structure, the first polysilicon is simultaneously pre-patterned. The silicon nitride layer is removed. A dielectric layer and a second polysilicon layer are sequentially formed over the substrate. The second polysilicon layer, the dielectric layer, the first polysilicon layer, and the tunnel oxide layer are patterned to form a desired strip structure on the substrate. A remaining portion of the first polysilicon layer serves as a gate of a memory cell. An interchangeable source/drain region is formed by ion implantation at each side of the gate structure, in which a source line parallel to the strip remaining structure.

18 Claims, 4 Drawing Sheets

METHOD FOR FABRICATING A FLASH MEMORY WITH SHALLOW TRENCH ISOLATION

CROSS-REFERENCE TO RELATED APPLICATION

This application claims the priority benefit of Taiwan application Ser. No. 87121152, filed Dec. 18, 1998, the full disclosure of which is incorporated herein by reference.

BACKGROUND OF THE INVENTION

1. Field of the Invention

This invention relates to semiconductor fabrication, and more particularly to a method for fabricating a flash memory device.

2. Description of Related Art

An erasable programmable read only memory (EPROM) device is often used in a computer or various electronic products. It has a advantage that all information including, for example, program codes or data stored in the (EPROM) device are not erased in a normal operation. The stored information can only be erased by exposing the EPROM device in an ultraviolet (UV) light for a certain time. Then, new desired information can be written in again. However, once the EPROM device is exposed to the UV light, all stored information is erased in once. Another writing-in process has to be performed from the beginning to the end, even though it may just have very few modifications only for the new updated information. In other words, it takes long for each modification or update. This causes a time consumption. Recently, the Intel company has developed a flash EPROM device, or called a flash memory, which allows the information to be erased and written-in block by block, so that the stored information can be locally modified without a need to repeat whole erasing and writing-in processes. A special memory cell used in the flash EPROM is called a EPROM with tunnel oxide cell (ETOX cell).

FIG. 1A is a top view of a portion of a substrate, schematically illustrating a conventional layout of a flash memory. FIG. 1B, is a cross-sectional view of a portion of a substrate taken along a line 1—1 in FIG. 1A, schematically illustrating the flash memory structure. FIG. 1C, is a cross-sectional view of a portion of a substrate taken along a line II—II in FIG. 1A, schematically illustrating the flash memory structure.

In FIG. 1A and FIG. 1B, a field oxide layer 104 formed by local oxidation process (LOCOS) is located on a semiconductor substrate 100 so as to define an active area 105. A tunnel oxide layer 102 is formed on the active area 105. A strip polysilicon layer 106 is formed over the substrate to cover an active area 105. A strip polysilicon layer 110 and a strip dielectric layer 108 are formed to vertically cross over the strip polysilicon layer 106. During the formation of the strip polysilicon layer 110, the substrate 100 at a portion other than the strip polysilicon layer 110 is exposed by continuous etching. The polysilicon layer 106 therefore is also etched during the formation of the strip polysilicon layer 110. A remaining portion of the polysilicon layer 106 becomes the polysilicon layer 106a. Also referring to FIG. 1C, an active area 105a, which originally is not covered by the strip polysilicon layer 106, is over-etched during etching the polysilicon layer 106. This over-etching effect causes that a trench 118 is formed in the substrate 100. After an ion implantation process, a source line 120, parallel to the strip polysilicon layer 110, is formed in the substrate 100. Since the source line 120 includes the trench 118, it may cause a electrical discontinuity that further causes a poor conductivity of the source line 120 and an even causes a failure of the source line 120. Moreover, since the field oxide layer 104 has a very large dimension, it is difficult to increase the memory integration.

SUMMARY OF THE INVENTION

It is therefore an objective of the present invention to provide a method for fabricating a flash memory with a simplified fabrication process. An electrical discontinuity of a source line is also effectively avoided.

In accordance with the foregoing and other objectives of the present invention, an improved method for fabricating a flash memory is provided. The improved method includes sequentially forming a tunnel oxide layer, a first polysilicon layer, and a silicon nitrite layer on a semiconductor substrate. A shallow trench isolation (STI) structure is formed in the substrate to define an active area. During the formation of the STI structure, the first polysilicon is simultaneously pre-patterned. The silicon nitride layer is removed. A dielectric layer and a second polysilicon layer are sequentially formed over the substrate. The second polysilicon layer, the dielectric layer, the first polysilicon layer, and the tunnel oxide layer are patterned to form a desired strip remaining structure on the substrate. A remaining portion of the first polysilicon layer serves as a gate of a memory cell. An interchangeable source/drain region is formed by ion implantation at each side of the gate structure, in which a source line parallel to the strip remaining structure.

In the foregoing, the invention uses the STI structure as the desired isolation structure. The device integration can effectively increase. The isolation structure in the conventional structure is a field oxide structure, which usually consumes available substrate area. Moreover, during the formation of the STI structure, the first polysilicon layer is simultaneously pre-patterned so that the fabrication process is simplified. The fabrication cost is reduced. Furthermore, since the first polysilicon has a uniform height over the substrate, when the first polysilicon layer is secondly patterned to form the gate structure, the substrate is not over etched at a certain portion. When a source line is formed, the source line has a uniform thickness. A conventional issue of discontinuity source line is effectively avoided. The source line contact resistance is effectively reduced.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

A flash memory device is fabricated on a substrate, which typically includes a cell region and a periphery region. Both the cell region and the periphery region are simultaneously fabricated even though some individual processes may be performed only on one desired region.

Figure 2A:
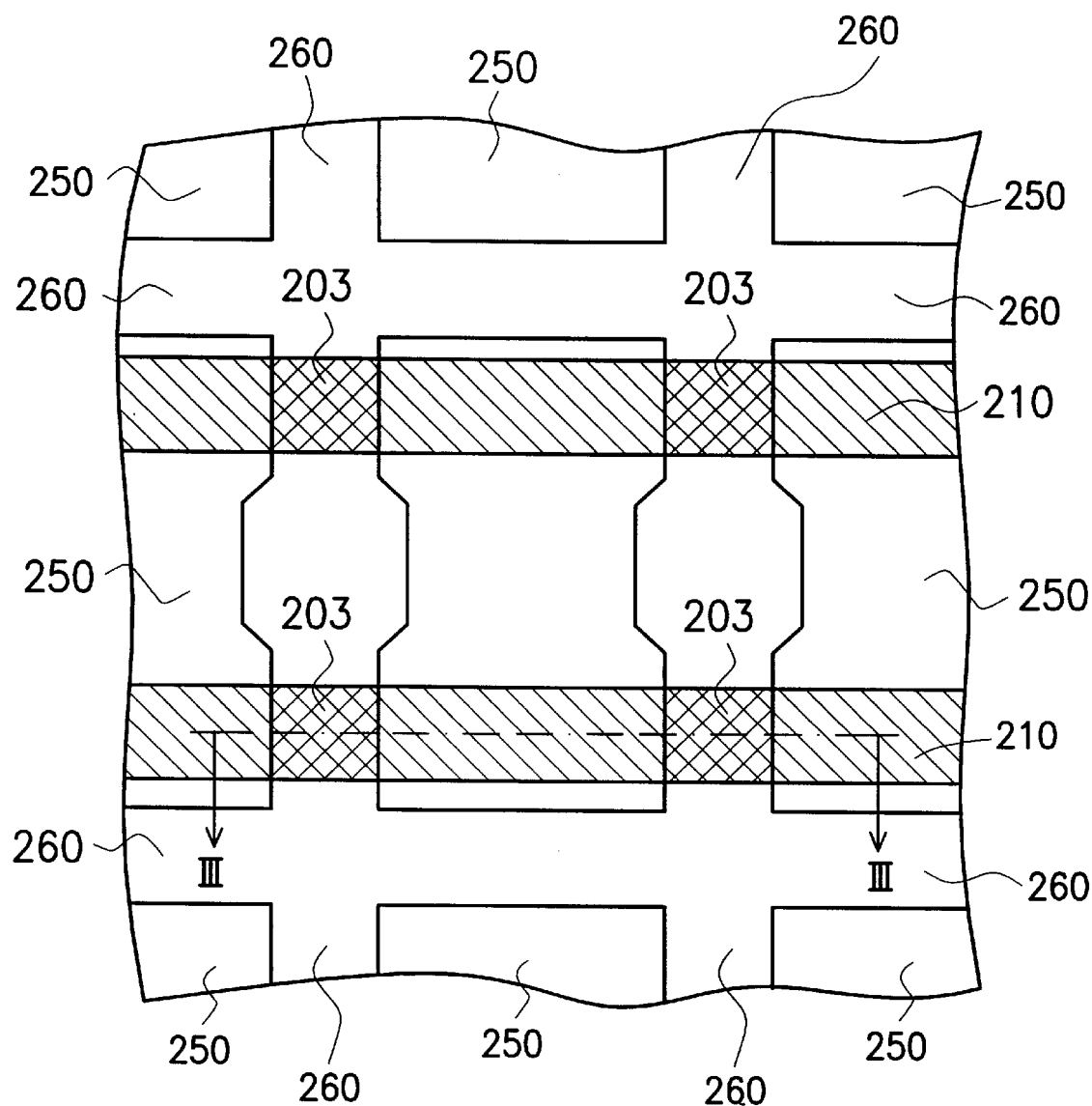
FIG. 2A is a top view of a portion of a substrate, schematically illustrating a layout of a flash memory at a cell region, according to a preferred embodiment of the invention.
Figure 2B:
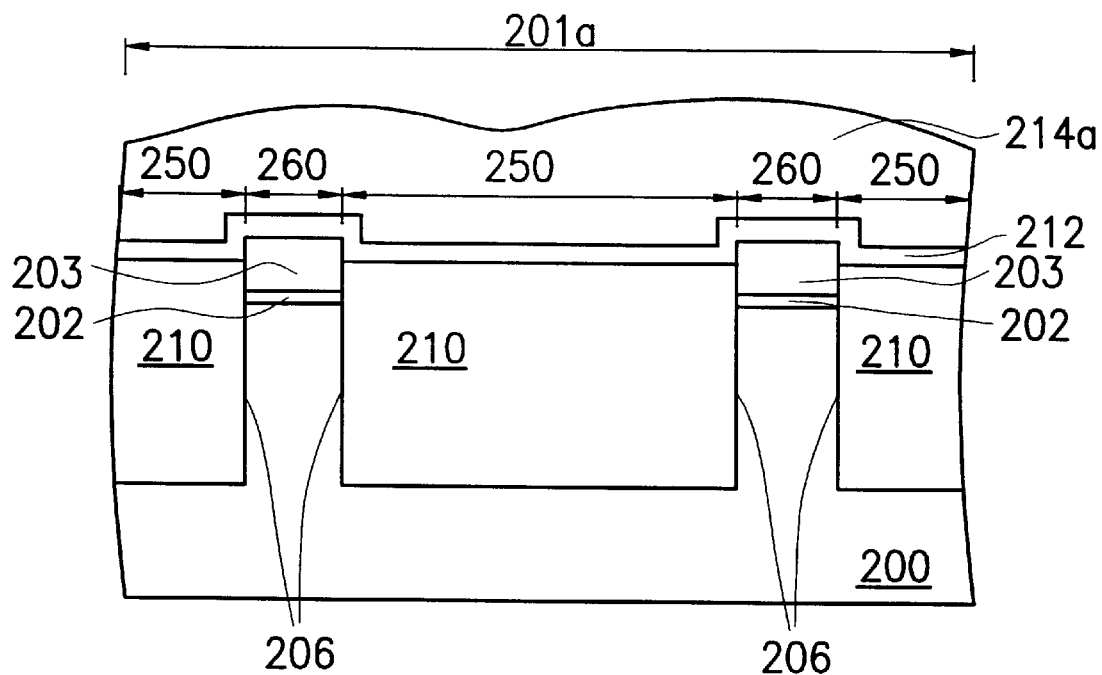
FIG. 2B is a cross-sectional view of a portion of a substrate taken along a line of III—III in FIG. 2A, schematically illustrating the flash memory structure at a cell region.
Figure 2C:
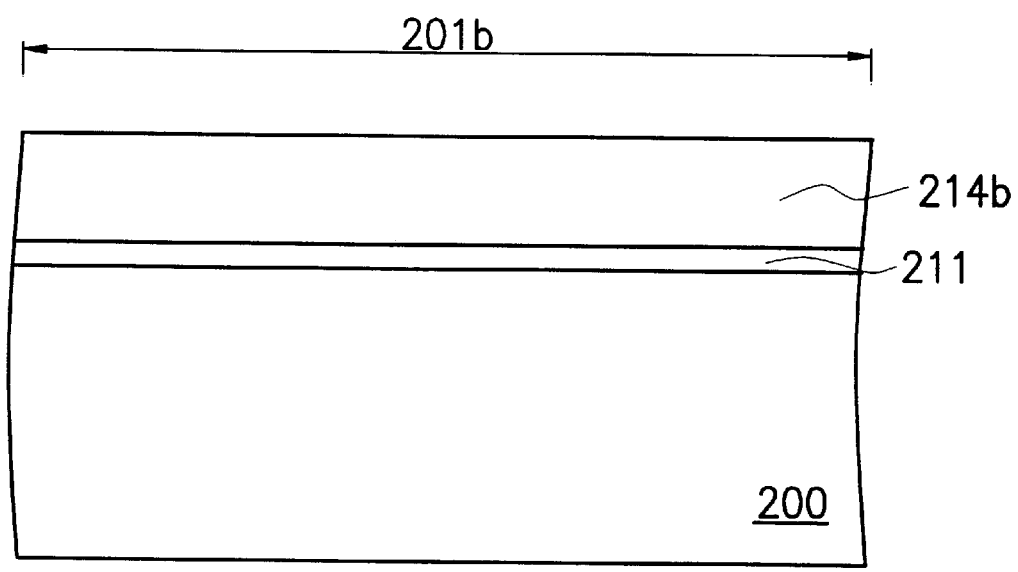
FIG. 2C is a cross-sectional view of a portion of a substrate, schematically illustrating a structure of the flash memory substrate at a periphery region.

FIG. 2A is a top view of a portion of a substrate, schematically illustrating a layout of a flash memory at a cell region, according to a preferred embodiment of the invention. FIG. 2B is a cross-sectional view of a portion of a substrate taken along a line of III—III in FIG. 2A, schematically illustrating the flash memory structure at a cell region. FIG. 2C is a cross-sectional view of a portion of a substrate, schematically illustrating a structure of the flash memory at a periphery region of the substrate.

In FIGS. 2A, 2B, and 2C, there is a semiconductor substrate 200 including a cell region 201a (FIG. 2A and FIG. 2B) and a periphery region 201b (FIG. 2C). A tunnel oxide layer 202 is formed over the substrate 200 by, for example, thermal oxidation. A polysilicon layer 203 is formed on the tunnel oxide layer 202, in which the polysilicon layer 203 at the cell region 201a is to be patterned later to form a structure shown in FIG. 2A and FIG. 2B. A mask layer, such as a silicon nitride layer, (not shown) is formed on the polysilicon layer 203 by chemical vapor deposition (CVD) with a thickness of about 1500 Å–2500 Å. A STI structure 210 is formed by patterning the silicon nitride layer, the polysilicon layer 203, the tunnel oxide layer 202, and the substrate 200. The STI structure 210 is formed at a desired isolation region 250 on the substrate 200, and a portion of the substrate 200 other than the isolation region 250 forms an active area 260. The patterning process results in a formation of a trench 206 (FIG. 2B) in the substrate 200 at the isolation region 250 with a depth of about 3000 Å–6000 Å. A liner oxide layer with a thickness of about 300 Å–600 Å is preferably formed on each side of the trench 206. An insulating layer, such as a silicon oxide layer, is formed over the substrate and planarized to form the STI structure 210. The planarization process includes, for example, a chemical mechanical polishing (CMP) process or an etching back process. The CMP process uses the silicon nitride layer as a polishing stop point. The etching back process uses the silicon nitride layer as an etching stop point. The silicon nitride layer is then removed.

At this stage the active area 260 is still covered by the polysilicon layer 203. During the formation for the STI structure, the polysilicon layer 203 is pre-patterned. The polysilicon layer 203 at the periphery region remains the same. The substrate 200 also has a planar top surface.

A dielectric layer 212 including, for example, a silicone-oxide/silicon-nitride/silicon-oxide (ONO) structure is formed over the substrate 200. At this stage, the periphery region 201b is covered by the dielectric layer 212, the tunnel oxide layer 202 and the polysilicon layer 203, which are subsequently removed by etching with a proper photoresist mask. After the photoresist mask is removed, a gate oxide layer 211 is formed on the substrate 200 at the periphery region 201b as shown in FIG. 2C.

A preliminary polysilicon layer is formed over the substrate 200 by, for example, CVD. A polysilicon gate layer 214a and a polysilicon gate layer 214b are respectively formed on the dielectric layer 212 and the gate oxide layer 211 by two different processes. The process for forming the polysilicon gate layer 214a at the cell region 201a includes patterning the preliminary polysilicon layer, the dielectric layer 212, the polysilicon layer 203, and the tunnel oxide layer 202 with a same etching mask. The patterned preliminary polysilicon layer forms a polysilicon gate layer 214a with a strip-like structure shown by a shaded area in FIG. 2A. A remaining portion of the polysilicon layer 203 is located at the double shaded area, serving as a floating gate structure of a flash memory cell. A more detailed etching characteristic is to be described in a subsequent paragraph. In FIG. 2C, the process for forming the polysilicon gate layer 214b at the periphery region 201b includes just patterning the preliminary polysilicon layer to form the polysilicon gate layer 214b on the gate oxide layer 211.

Figure 1A:
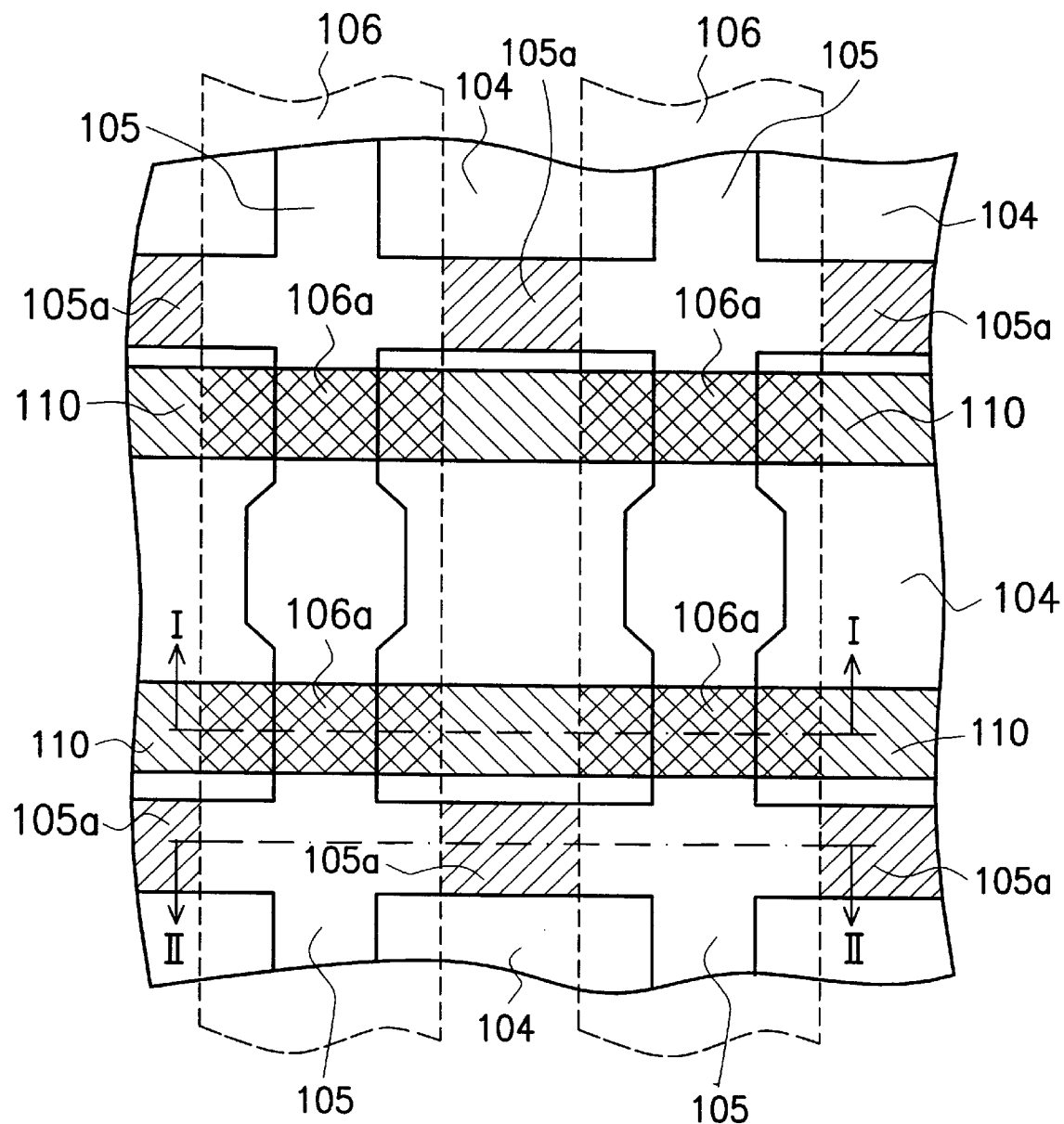
FIG. 1A is a top view of a portion of a substrate, schematically illustrating a conventional layout of a flash memory.
Figure 1B:
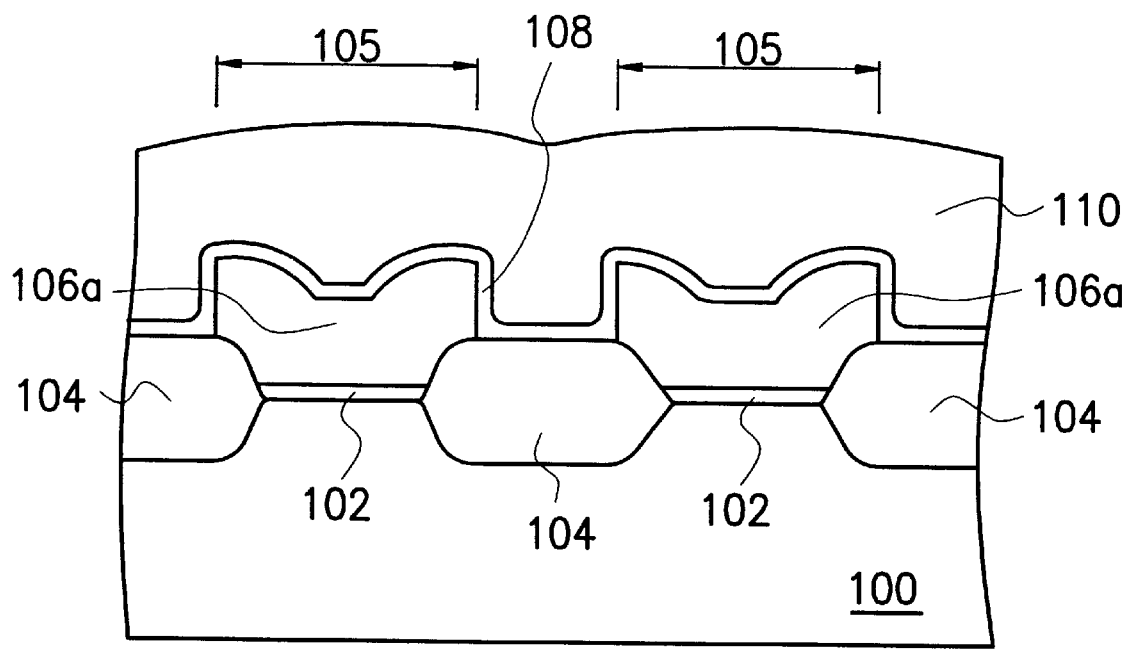
FIG. 1B, is a cross-sectional view of a portion of a substrate taken along a line I—I in FIG. 1A, schematically illustrating the flash memory structure.
Figure 1C:
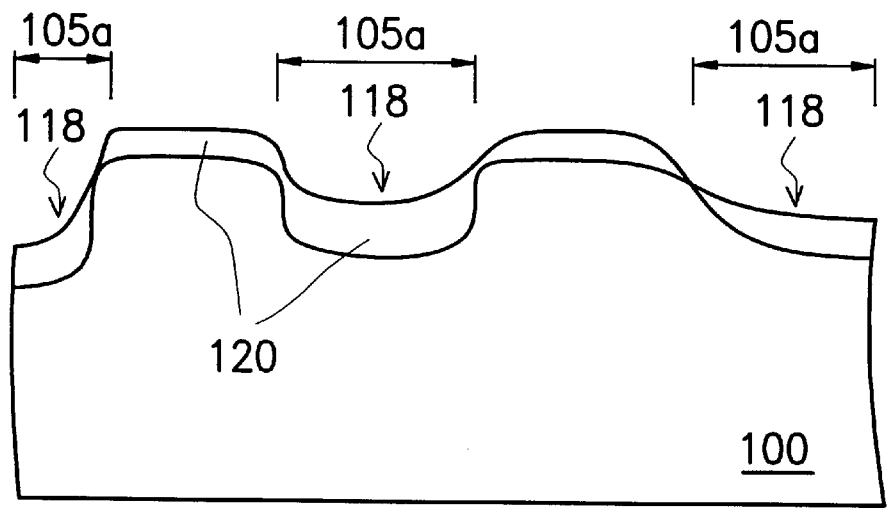
FIG. 1C is a cross-sectional view of a portion of a substrate taken along a line II—II in FIG. 1A, schematically illustrating the flash memory structure.

The polysilicon layer 214a has a strip-like structure as shown by the shaded area in FIG. 2A, and serves as a control gate of the flash memory cell. During etching process for forming the polysilicon layer 214a, a portion of the STI structure 210 and a portion of the substrate at the active area 260 other than the polysilicon layer 214a are exposed. The patterning process includes, for example, photolithography and etching. Since the polysilicon layer 203 at the etched portion, before being etched, has a uniform thickness and height on the substrate 200, the substrate 200 is evenly exposed. There is no over-etching occurring at some locations of the substrate 200. In a conventional situation, as shown in FIG. 1A and FIG. 1C, the active region 105a of the substrate 100 is over etched, resulting in the formation of the trench 118.

An ion implantation is performed to form an interchangeable source/drain region in the substrate 200 at each side of the polysilicon layer 203. A source line parallel to the polysilicon gate layer 214a is therefore formed in the substrate 200 at a portion of the active region 260. The source line is coupled to each source region of an individual memory cell. The source line of the invention has a uniform doped depth so that the source line has a sufficiently good profile without a poor continuity. The source line resistance is effectively reduced.

The rest fabrication process to accomplish the flash memory device are well known by the one skilled in the art, and are not further described here.

In conclusion, the invention has several characteristics as follows:

1. The invention introduces a STI structure to take the place of a conventional field oxide structure so that the device integration can be effectively improved.

2. As the STI structure is formed, the lower polysilicon layer 203 is simultaneously pre-patterned. This can save one patterning process to form the lower polysilicon like the conventional polysilicon layer 106. The fabrication process is simplified and the fabrication cost is reduced.

3. Since the lower polysilicon layer 203 is uniformly formed on the substrate, as the lower polysilicon layer 203 is patterned, the substrate 200 is uniformly exposed without a local over-etching phenomenon. As the source line is formed, there is no trench occurring on the source line. A source line resistance is effectively reduced.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating flash memory device, the method comprising:

forming a tunnel oxide layer on a semiconductor substrate;

forming a first polysilicon layer on the tunnel oxide layer;

forming a mask layer on the first polysilicon layer;

patterning the substrate, the tunnel oxide layer, the first polysilicon layer, and the mask layer to form a trench in the substrate;

filling the trench with a shallow trench isolation (STI) structure;

removing the mask layer;

sequentially forming a dielectric layer and a second polysilicon layer over the substrate so that the STI structure and the first polysilicon layer are covered;

patterning the second polysilicon layer, the dielectric layer, the first polysilicon layer, and the tunnel oxide layer, wherein the second polysilicon layer is patterned to form a remaining strip-like structure serving as a control gate, and the first polysilicon layer is patterned to form floating gates, a portion of the substrate other than the remaining strip-like structure is exposed, and the remaining strip-like structure lays continuously and unbroken across the floating gates and the substrate; and performing an ion implantation process to form an interchangeable source/drain region in the substrate at the exposed portion after forming the control gate and the floating gates, wherein a source line is automatically formed.

2. The method of claim 1, wherein the step of forming the tunnel oxide layer comprises a thermal oxidation.

3. The method of claim 1, wherein the step of forming the first polysilicon layer comprises chemical vapor deposition (CVD).

4. The method of claim 1, wherein the step of sequentially forming the dielectric layer and the second polysilicon layer over the substrate comprises CVD to form the second polysilicon layer.

5. The method of claim 1, wherein in the step of sequentially forming the dielectric layer and the second polysilicon layer over the substrate, the dielectric layer is formed to comprise a silicon-oxide/silicon-nitride/silicon-oxide structure.

6. The method of claim 1, wherein the mask layer comprises silicon nitride.

7. The method of claim 1, wherein the step of filling the trench with STI structure further comprises:

forming a liner oxide layer on each sidewall of the trench;

forming a preliminary insulating layer over the substrate to fill the trench; and performing a planarization process to remove the preliminary insulating layer so as to expose the mask layer, in which a remaining portion of the preliminary insulating layer forms the STI structure to fill the trench.

8. The method of claim 7, wherein the step of performing the planarization process comprises a chemical mechanical polishing (CMP) process, using the mask layer as a polishing stop point.

9. The method of claim 7, wherein the step of performing the planarization process comprises an etching back process, which use the mask layer as an etching stop point.

10. A method for fabricating flash memory device on a semiconductor substrate, which comprises a cell region and a periphery region, the method comprising:

forming a tunnel oxide layer on a semiconductor substrate;

forming a first polysilicon layer on the tunnel oxide layer;

forming a mask layer on the first polysilicon layer;

patterning the substrate, the tunnel oxide layer, the first polysilicon layer, and the mask layer to form a trench in the substrate;

filling the trench with a shallow trench isolation (STI) structure;

removing the mask layer;

forming a dielectric layer on the first polysilicon layer at the cell region;

forming a gate oxide layer on the substrate at the periphery region, wherein the tunnel oxide layer, the first polysilicon layer, and the dielectric layer at the periphery region are removed;

forming a second polysilicon layer over the substrate;

patterning the second polysilicon layer, the dielectric layer, the first polysilicon, and the tunnel oxide layer at the cell region so as to obtain a remaining strip-like structure on the substrate at the cell region to form a floating gate and a control gate, in which a portion of the substrate other than the remaining strip-like structure is exposed, wherein the second polysilicon layer and the gate oxide layer at the periphery region are also patterned; and performing an ion implantation process to form an interchangeable source/drain region in the substrate at the exposed portion, wherein a source line is formed.

11. The method of claim 10, wherein the step of forming the tunnel oxide layer comprises a thermal oxidation.

12. The method of claim 10, wherein the step of forming the first polysilicon layer comprises chemical vapor deposition (CVD).

13. The method of claim 10, wherein the step of forming the second polysilicon layer comprises CVD.

14. The method of claim 10, wherein in the step of forming the dielectric layer, the dielectric layer comprises a silicon-oxide/silicon-nitride/silicon-oxide structure.

15. The method of claim 10, wherein the mask layer comprises silicon nitride.

16. The method of claim 10, wherein the step of filling the trench with the STI structure further comprises:

forming a liner oxide layer on each sidewall of the trench;

forming a preliminary insulating layer over the substrate to fill the trench; and performing a planarization process to remove the preliminary insulating layer so as to expose the mask layer, in which a remaining portion of the preliminary insulating layer forms the STI structure to fill the trench.

17. The method of claim 16, wherein the step of performing the planarization process comprises a chemical mechanical polishing (CMP) process, using the mask layer as a polishing step point.

18. The method of claim 16, wherein the step of performing the planarization process comprises an etching back process, which uses the mask layer as an etching stop point.

* * * * *